(12) United States Patent
Sun et al.

(10) Patent No.: US 11,978,631 B2
(45) Date of Patent: May 7, 2024

(54) FORMING CONTACT HOLES WITH CONTROLLED LOCAL CRITICAL DIMENSION UNIFORMITY

(71) Applicant: Tokyo Electron Limited, Tokyo (JP)

(72) Inventors: Junling Sun, Albany, NY (US); Katie Lutker-Lee, Albany, NY (US); Angelique Raley, Albany, NY (US); Andrew Metz, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 719 days.

(21) Appl. No.: 17/116,911

(22) Filed: Dec. 9, 2020

(65) Prior Publication Data
US 2022/0181152 A1 Jun. 9, 2022

(51) Int. Cl.
| | |
|---|---|
| *H01L 21/033* | (2006.01) |
| *H01L 21/02* | (2006.01) |
| *H01L 21/027* | (2006.01) |
| *H01L 21/311* | (2006.01) |
| *H01L 21/66* | (2006.01) |
| *H01L 21/768* | (2006.01) |

(52) U.S. Cl.
CPC ...... *H01L 21/0337* (2013.01); *H01L 21/0338* (2013.01); *H01L 21/31116* (2013.01); *H01L 21/31144* (2013.01); *H01L 21/76802* (2013.01); *H01L 21/76816* (2013.01); *H01L 22/12* (2013.01); *H01L 22/20* (2013.01); *H01L 21/02063* (2013.01); *H01L 21/0276* (2013.01); *H01L 21/0279* (2013.01)

(58) Field of Classification Search
CPC .................................................. H01L 21/31144
See application file for complete search history.

(56) References Cited

U.S. PATENT DOCUMENTS

2010/0065531 A1* 3/2010 Kiehlbauch ......... H01L 21/0337
216/41

OTHER PUBLICATIONS

Clark, R., et al., "Perspective: New process technologies required for future devices and scaling", Applied Materials, 6, 058203, https://doi.org/10.1063/1.5026805, May 29, 2018, 13 pages.

Hubner, H., "Calculations on Deposition and Redeposition in Plasma Etch Process", Journal on the Electrochemical Society, vol. 139, No. 11, ISSN 0013-4651, Nov. 1992, pp. 3302-3309.

* cited by examiner

*Primary Examiner* — Brigitte A Paterson
(74) *Attorney, Agent, or Firm* — Slater Matsil, LLP

(57) ABSTRACT

A method for forming a device includes forming a hole pattern in a resist layer disposed over a substrate. The substrate includes contact regions disposed over a major surface of the substrate and a dielectric layer disposed over the contact regions. The resist layer is disposed over the dielectric layer and the hole pattern includes through openings in the resist layer that are aligned with the contact regions. The through openings include a first through opening having a first critical dimension and a second through opening having a second critical dimension greater than the first critical dimension. The method includes modifying the hole pattern by depositing a material including silicon within the through openings by exposing the hole pattern to a first plasma generated from a gas mixture including $SiCl_4$ and hydrogen, and then etching holes in the dielectric layer through the modified hole pattern, exposing the contact regions.

22 Claims, 9 Drawing Sheets

FORMING CONTACT HOLES WITH CONTROLLED LOCAL CRITICAL DIMENSION UNIFORMITY

TECHNICAL FIELD

The present invention relates generally to semiconductor fabrication, and, in particular embodiments, to forming contact holes with controlled local critical dimension uniformity.

BACKGROUND

Generally, semiconductor devices, such as integrated circuits (IC's) are fabricated by sequentially depositing and patterning layers of dielectric, conductive, and semiconductor materials over a semiconductor substrate using photolithography and etch to form structures for circuit components and interconnect elements (e.g., transistors, resistors, capacitors, metal lines, contacts, and vias). At each successive technology node, feature sizes are shrunk to roughly double the component packing density. A direct method for printing the higher resolution patterns is to reduce the wavelength of the light source. The 248 nm deep ultraviolet (DUV) radiation source (KrF laser), used to expose critical patterns at the 250 nm and 130 nm nodes, was replaced by the 193 nm ArF laser, starting at the 90 nm node. Features down to 35 nm may be printed using 193 nm lithography with resolution enhancement techniques, such as immersion lithography. The 193 nm optics is further extended to 14 nm and even 10 nm nodes using multiple patterning techniques, but at higher cost and processing complexity associated with the additional masks. At the sub-10 nm regime, DUV may be replaced by the even shorter 13.5 nm wavelength extreme ultraviolet (EUV) technology. While EUV promises high resolution with fewer masks, it has to bring together all the components of a lithography system (radiation source, scanner, mask, and resist), overcoming each component's engineering hurdles. One major issue is that resists exposed with EUV radiation are sensitive to stochastic effects resulting in random failures in printing the extremely small areas of sub-10 nm designs. The stochastic effects associated with EUV lithography are a major concern because random failures in printing increases the local critical dimension uniformity (LCDU) of interconnect elements. As the size of interconnect elements and the edge placement error (EPE) budget continues to shrink with each advanced technology node, even small variations in critical dimensions can have a significant effect on device performance. Further innovations are needed in this area for successful deployment of EUV lithography in high volume semiconductor IC manufacturing.

SUMMARY

In accordance with an embodiment of the present invention, a method for forming a device includes forming a hole pattern in a resist layer disposed over a substrate, the substrate including contact regions disposed over a major surface of the substrate and a dielectric layer disposed over the contact regions, the resist layer being disposed over the dielectric layer, the hole pattern including through openings in the resist layer that are aligned with the contact regions. The method includes modifying the hole pattern by depositing a material including silicon within the through openings by exposing the hole pattern to a first plasma generated from a gas mixture including SiCl$_4$ and hydrogen, where the through openings include a first through opening having a first critical dimension and a second through opening having a second critical dimension greater than the first critical dimension, and where a first thickness of the material deposited on sidewalls of the first through opening is greater than a second thickness of the material deposited on sidewalls of the second through opening; and etching holes in the dielectric layer by exposing the dielectric layer to a second plasma through the modified hole pattern, the holes exposing the contact regions.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a top-down view of the device after forming a hole pattern within a resist layer, and FIG. 1B illustrates a corresponding cross-sectional view of the device after forming the hole pattern within the resist layer;

FIG. 2A illustrates a top-down view of the device after forming a modified hole pattern with an improved LCDU using a plasma deposition process, and FIG. 2B illustrates a cross-sectional view of the device after forming the modified hole pattern with an improved LCDU using a plasma deposition process;

FIGS. 4-6 illustrate cross-sectional views of a semiconductor device during various stages of fabrication in accordance with an embodiment of the present application, wherein FIG. 4 illustrates a cross-sectional view of a semiconductor device after the device undergoes a plasma trimming process, FIG. 5 illustrates the device after a plasma etching process is used to transfer a hole pattern to a dielectric layer through a patterned etch mask, and FIG. 6 illustrates the device after the etch mask is removed;

FIGS. 8A-8F illustrate cross-sectional views of a semiconductor device during various stages of fabrication in accordance with an alternative embodiment of the present application, wherein FIG. 8A illustrates the device after forming a hole pattern in a resist layer, FIG. 8B illustrates the device after forming a modified hole pattern with an improved LCDU using a plasma deposition process, FIG. 8C illustrates the device after undergoing a plasma trim process, FIG. 8D illustrates the device after etching through an underlying layer, forming an etch mask, FIG. 8E illustrates the device after a hole pattern is formed in a dielectric layer, and FIG. 8F illustrates the device after removing the etch mask;

DETAILED DESCRIPTION OF ILLUSTRATIVE EMBODIMENTS

Figure 1A:
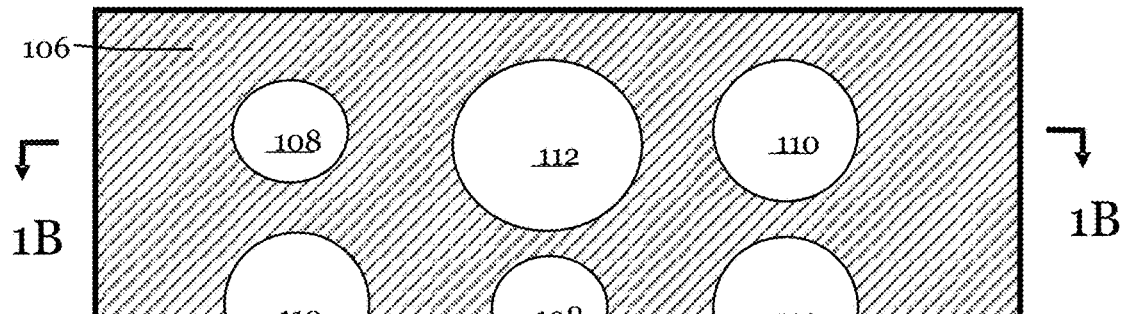
FIGS. 1A-1B illustrate schematic views of a semiconductor device during various stages of fabrication in accordance with an embodiment of the present application, where

The present invention relates generally to methods of forming patterned etch masks, and, in particular embodiments, to methods to form patterned etch masks for forming nanometer scaled contact holes having a low local critical dimension uniformity on a semiconductor substrate.

The shorter 13.5 nm wavelength used in extreme ultraviolet (EUV) lithography may offer a higher resolution single patterning capacity, which reduces the number of masks required and process cost in comparison to the 193 nm wavelength used in deep ultraviolet (DUV) lithography. However, EUV has a number of engineering difficulties arising from the high energy photons generated by the 13.5 nm wavelength. This disclosure describes embodiments of methods to mitigate some of those issues.

One issue with EUV is that a EUV photon has 14.3 times the energy of a DUV photon which results in a lower quantity of photons in a fixed exposure to define the edges of an exposed region. However, some regions randomly receive more photons than others. Further, when the scanner progresses from die to die across a wafer, the same region on every die may randomly receive different exposures. This is known as shot noise. Shot noise follows a Poisson distribution and results in exposure fluctuations that are many times larger than exposure fluctuations in DUV. Also, as the size of a feature gets smaller, the impact of exposure fluctuations increases. The randomness of locations where photons interact with the resist causes blurring of the edge of an exposed region resulting in significant variations of the critical dimensions of a pattern of device elements formed on an etch mask. Shot noise is much more significant in EUV in comparison to DUV because as the photon density decreases, the mean distance between photon-resist interaction locations increases.

Another issue associated with EUV is that photon absorption within the resist layer or an underlying layer generates high-energy photoelectrons that quickly cascade into secondary emission of lower energy electrons. These electrons get scattered with random trajectories and follow a random process, resulting in chemical reactions in the resist at a considerable distance from where the photon was absorbed. This is known as random walk, and results in exposure of a region that was not defined by the original pattern.

Another issue associated with EUV is low etch selectivity of patterned EUV etch masks. A process flow for fabrication of semiconductor devices comprises multiple instances wherein a pattern of device elements imprinted on a photomask is transferred to a target layer in a semiconductor substrate by etching the target layer using a patterned etch mask. Typically, when forming a pattern of device elements, a patterned resist layer is formed and used as an etch mask to transfer the pattern to underlying layers by selective etching of exposed underlying layers through the etch mask. The resist loss during etching has to be limited in order for the resist mask to ensure that the protected region is not damaged by the etchants. Even though it is advantageous to use a thicker resist film for this reason, there is a tradeoff that leads to the use of relatively thin EUV films. Increasing the resist thickness may result in an undesirable non-uniform vertical exposure. As photon absorbance of the resist material increases, non-uniformity increases. Typically, the resist thickness is chosen to be as low as possible to mitigate non-uniformities.

Embodiments described in this disclosure overcome these and other disadvantages by coating a EUV photoresist layer patterned with through openings with a silicon based material using plasma processing techniques.

An example embodiment of a method for improving the etch selectivity and LCDU of an etch mask will be described with reference to FIGS. 1A-1B and FIGS. 2A-2B.

Figure 1B:
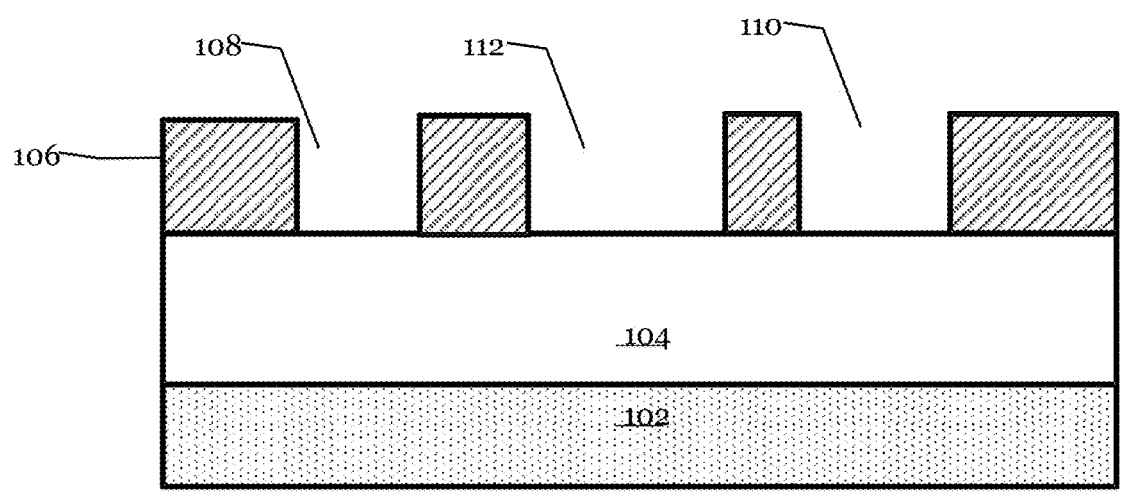
Figure 2A:
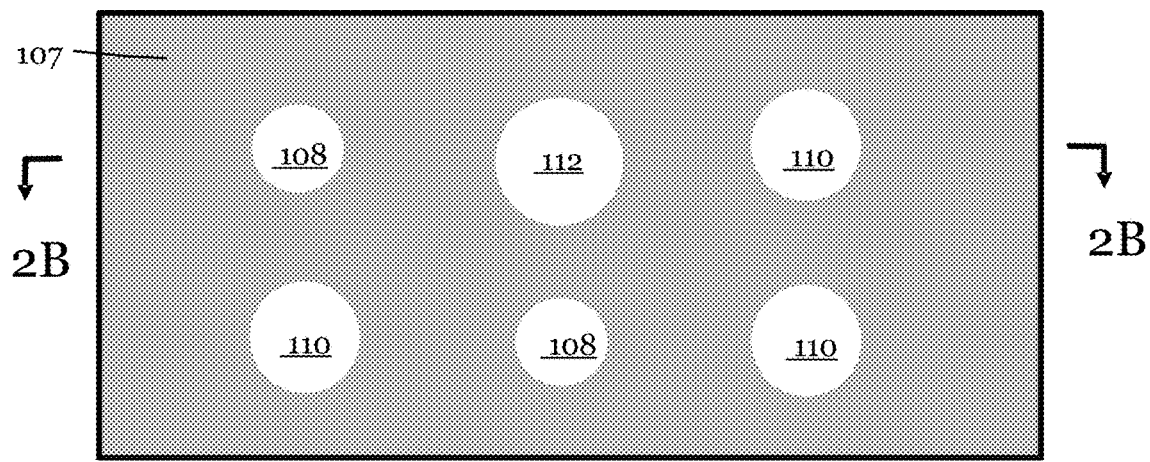
FIGS. 2A-2B illustrate schematic views of a semiconductor device during various stages of fabrication in accordance with an embodiment of the present application, where
Figure 2B:
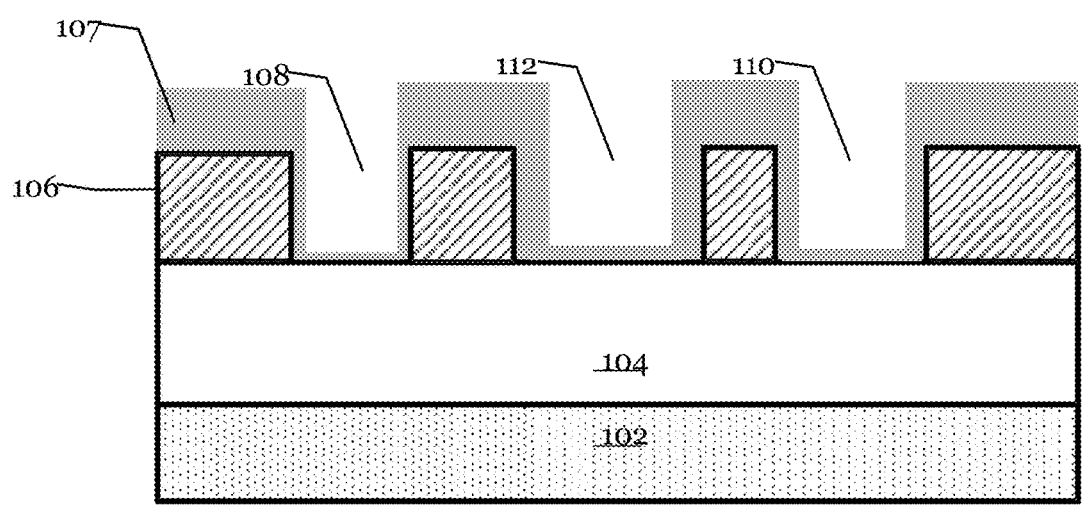

FIGS. 1A-1B and FIGS. 2A-2B illustrate top-down and cross-sectional views of a semiconductor device during various stages of fabrication in accordance with an embodiment of the present application, wherein FIGS. 1A-1B illustrate a top-down and a cross-sectional view of the device after forming a hole pattern within a resist layer, respectively, and FIGS. 2A-2B illustrate a top-down and a cross-sectional view of the device after forming a modified hole pattern with an improved LCDU using a plasma deposition process, respectively.

Referring to the top-down view of the semiconductor device illustrated in FIGS. 1A, a patterned resist layer 106 is formed over a substrate 102. In this embodiment, the patterned resist layer 106 is a hole pattern comprising through openings. In this example, the patterned resist layer 106 may be a sacrificial layer of an organic photoresist or metal oxide photoresist film sensitive to EUV radiation in the wavelength range of 10 nm to about 14 nm, typically 13.5 nm. Although this process is described with reference to EUV lithography, lithography methods using longer wavelengths such as vacuum ultraviolet (VUV) radiation in the 100 nm to 200 nm range may be used.

In one embodiment, the patterned resist layer 106 comprises photoresist. To form the hole pattern, the photoresist is exposed and developed to transfer the through openings from a photomask to the photoresist, using, for example, 13.5 nm wavelength EUV lithography process steps known to those having ordinary skill in the art.

As explained above, in one embodiment where EUV lithography is used, some of the through openings formed in the patterned resist layer 106 may be exposed to different quantities of photons due to stochastic effects associated with EUV lithography. As a result, the through openings may have a high variation in critical dimensions and an undesirable LCDU.

For example, as an illustration of the stochastic processes, some of which was explained above, the patterned resist layer 106 may comprise a first through opening 108 having a first critical dimension, a second through opening 110 having a second critical dimension and a third through opening 112 having a third critical dimension. The first critical dimension is smaller than both the second critical dimension and the third critical dimension, and the second critical dimension is smaller than the third critical dimension while being greater than the first critical dimension.

In various embodiments, the through openings have an LCDU. For example, the critical dimensions of each of the through openings may be measured to compute a first LCDU. For example, the critical dimension of a through opening may be defined as the diameter of the through opening. Then, the LCDU may be determined by calculating the 3 sigma variation of the measured critical dimensions of all of the through openings in the hole pattern. For example, the critical dimensions may be measured using, wafer-critical dimension-scanning electron microscopy (CD- SEM), wafer-critical dimension small angle x-ray scattering (CD-SAXS), or wafer optical scatterometry.

Referring to FIG. 1B, the patterned resist layer 106 comprising the first through opening 108, the second through opening 110, and the third through opening 112 are formed over a dielectric layer 104 formed over a substrate 102. The dielectric layer 104 may be, for example, an intermetal dielectric (IMD) comprising a low-k dielectric material. The substrate 102 may include multiple interconnect levels regions comprising dielectric films with embedded conductive interconnect elements formed over a major surface of the substrate 102.

The substrate 102 may comprise a single-bulk semiconductor or semiconductor-on-insulator substrate in which various devices may be fabricated. For example, the substrate 102 may comprise contact regions formed over a major surface of the substrate 102 such that each of the openings is aligned with respective contact regions.

In various embodiments, holes are intended to be etched into the dielectric layer 104 to expose the contact regions formed on the substrate 102 using the patterned resist layer 106 as an etch mask. As a result of the stochastic effects of EUV lithography described above, the etch mask comprising the patterned resist layer 106 may have a high variation between the critical dimensions of the through openings formed in the patterned resist layer 106, resulting in an undesirable LCDU and a misalignment between the holes and the contact regions.

Advantageously, as illustrated in FIGS. 2A-2B a final etch mask with an improved etch selectivity and LCDU is formed. Referring to FIG. 2A, a material comprising silicon 107 is deposited over the patterned resist layer 106, forming a modified hole pattern. In one embodiment, the material comprising silicon 107 may be subsequently oxidized by exposure to oxygen (e.g., exposure to air), or otherwise subsequently treated to change its composition. For example, the material comprising silicon 107 may comprise materials such as silicon oxide or silicon nitride. The material comprising silicon 107 may be formed in either a dedicated deposition tool or in a plasma etch chamber.

The material comprising silicon 107 may be selectively deposited over the patterned resist layer 106 using a first plasma from a first plasma process. The first plasma process may comprise a plasma-enhanced vapor deposition (PECVD) process in one embodiment. The process gases to generate the first plasma may include silicon tetrachloride and hydrogen, and the carrier gases may include one or more gases such as helium, argon, and nitrogen. Other silicon containing gases such as silicon tetrafluoride may also be used. The first plasma may be tuned for selectivity, conformality, profile, and deposition rate based on standard plasma etch parameters such as chamber pressure, chamber temperature, radio frequency (RF) source power, RF bias power, RF waveform (e.g., continuous wave RF, pulsed RF, square pulse, sawtooth pulse, and the like), deposition time, and the composition and flow rates of various process and carrier gases.

In one embodiment, the flow rate for silicon tetrachloride may be about 5 sccm to about 30 sccm, typically 20 sccm; the flow rate for hydrogen may be about 3 sccm to about 300 sccm, typically 240 sccm; and the flow rate for argon may be about 10 sccm to about 1000 sccm, typically 290 sccm. In other embodiments argon may not be present in the gas mixture flowing into the plasma processing chamber. In one embodiment, RF source power may be about 0 W to about 2000 W, typically about 500 W. The chamber pressure may be about 10 mT to about 800 mT, typically about 50 mT. The deposition may be performed at a temperature between 0° C. and 100° C., for example, 30° C.

Advantageously, the first plasma has a fast deposition rate that may be adjusted up to a rate up to 2 nm/s. One advantage of this fast deposition rate is that it reduces the process time of the first plasma, and thus, reduces the time and increases the throughput of semiconductor fabrication.

Referring to FIG. 2B, the material comprising silicon 107 is deposited over the patterned resist layer 106 covering the sidewalls and the bottom surfaces of the first through opening 108, the second through opening 110, and the third through opening 112.

In various embodiments, the deposition process advantageously deposits more material within wider openings due to micro-loading effect. Due to the micro-loading effect, the sidewalls of through openings with larger diameters or critical dimensions (CDs) tend to have more of the material comprising silicon 107 being deposited as compared to through openings with smaller CDs. Accordingly, the film thickness of the material comprising silicon 107 deposited over the through openings with a greater critical dimension is greater than the film thickness deposited over the through openings with a smaller critical dimension. Therefore, the film thickness of the material comprising silicon 107 deposited on the sidewalls and bottom surface of the third through opening 112 is greater than the film thickness of the material comprising silicon 107 deposited on the sidewalls and bottom surface of the through opening 110, and the film thickness of the material comprising silicon 107 deposited on the sidewalls and bottom surface of the second through opening 110 is greater than the film thickness deposited on the sidewalls and bottom surface of the first through opening 108.

Depositing the material comprising silicon 107 on the sidewalls of the through openings reduces their critical dimensions, respectively, and creates a modified hole pattern comprising the patterned resist layer 106 and the deposited material comprising silicon 107. The modified hole pattern comprises modified through openings having modified critical dimensions. However, as more material is deposited within wider openings, the variation in critical dimension between the openings is advantageously reduced. In this embodiment, the first through opening 108 now corresponds to a fourth critical dimension, the second through opening 110 now corresponds to fifth critical dimension, and the third through opening 112 now corresponds to a sixth critical dimension. The fourth critical dimension is less than the first critical dimension, the fifth critical dimension is less than the second critical dimension, and the sixth critical dimension is less than the third critical dimension.

Advantageously, the deposition process selectively deposits more material comprising silicon 107 on sidewalls of the wider through openings (i.e., greater critical dimension) than sidewalls of the narrower through openings (i.e., smaller critical dimension). One advantage of depositing a thicker layer of the material comprising silicon 107 over the sidewalls of wider through openings is that the critical dimensions of wider through openings will decrease more than narrower through openings, reducing the variation between the critical dimensions of the modified through openings, and resulting in a final etch mask with a lower LCDU. For example, the difference between the third critical dimension and the sixth critical dimension is greater than the difference between the fourth critical dimension and the first critical dimension. Therefore, the difference between the third critical dimension and the first critical dimension is greater than the difference between the sixth critical dimension and the fourth critical dimension.

In various embodiments, the fourth critical dimension, the fifth critical dimension and the sixth critical dimension are measured and a modified LCDU is determined in the same manner described in FIG. 1A above. The modified LCDU being less than the first LCDU.

Also, as illustrated in FIG. 2B, the film thickness of the material comprising silicon 107 deposited over the patterned resist layer and on the sidewalls of the through openings is greater than the film thickness deposited on the bottom surfaces of the through openings.

As understood by those with ordinary skill in the art, patterning EUV resists may leave minute residual resist residue behind. In various embodiments, before undergoing the first plasma depositing the material comprising silicon 107, the patterned resist layer 106 may undergo a descum process to remove excess photoresist residue by exposing the patterned resist layer 106 to a third plasma.

In various embodiments, the descum process using a third plasma process gases may include oxygen and hydrobromic acid (HBr), and the carrier gases may include one or more inert gases such as helium, argon, and nitrogen. The descum process may be tuned for selectivity, conformality, profile, and etch rate based on standard plasma etch parameters such as chamber pressure, chamber temperature, HF and LF source powers, HF and LF bias powers, HF and LF waveforms, process time, and the composition and flow rates of various process and carrier gases.

Figure 3:
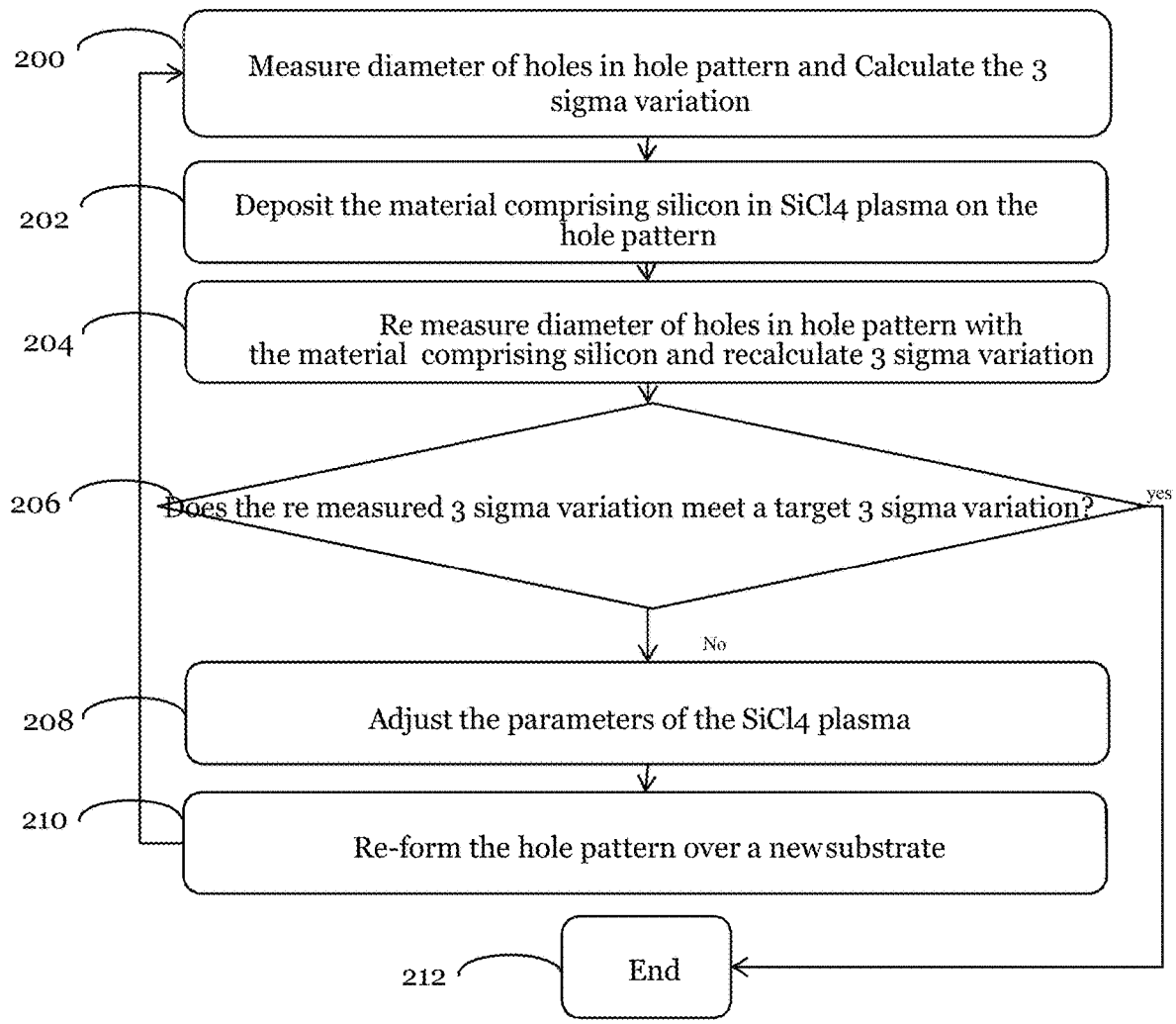
FIG. 3 is a flow chart illustrating an example process flow used to adjust a plasma deposition process in order to meet a target LCDU in accordance with an embodiment of the present application.

FIG. 3 is a flow chart illustrating an example process flow used to adjust a plasma deposition process in order to meet a target LCDU in accordance with an embodiment of the present application. This flow chart may be used during process development or later during within the wafer fabrication facility during production to fine tune a previously developed base line process.

As illustrated in block 200 and described with reference to FIGS. 1A-1B, a hole pattern comprising through openings is formed as a patterned resist layer 106 over a dielectric layer 104 formed over a substrate 102. Upper surfaces of the dielectric layer are exposed on the bottom surfaces of the through openings formed in the patterned resist layer 106. The patterned resist layer 106 may comprise the same material and may be formed in the same manner described in FIGS. 1A-1B. The critical dimensions of the through openings are measured and a first LCDU is determined. The critical dimensions and the first LCDU may be measured and determined, respectively, in the same manner described in FIGS. 1A-1B.

As next illustrated in block 202 and described with reference to FIGS. 2A-2B, a modified hole pattern comprising modified through openings (e.g. the modified hole pattern with an improved LCDU as described in FIGS. 2A-2B) is formed by selectively depositing a material comprising silicon 107 over the patterned resist layer 106 using a first plasma. The material comprising silicon 107 and the first plasma may both comprise the same material and may be formed in the same manner described in FIGS. 2A-2B.

As next illustrated in block 204 and described with reference to FIGS. 2A-2B, the modified critical dimensions of the modified through openings after the material comprising silicon 107 is deposited are measured and a modified LCDU is determined. The modified LCDU is less than the first LCDU. The critical dimensions and the modified LCDU may be measured and determined, respectively, in the same manner described in FIGS. 1A-1B.

Referring next to block 206 and described with reference to FIGS. 2A-2B, the modified LCDU is compared with a target LCDU, which for example, may be an upper-bound of a process window defined for the manufacturing process. If the modified LCDU is less than or equal to the target LCDU, the method proceeds to block 212 and the first plasma process is not adjusted at this time. If the modified LCDU is greater than the target LCDU the method continues to block 208.

As next illustrated in block 208 and described with reference to FIGS. 2A-2B, if the modified LCDU is greater than a target LCDU, the first plasma is adjusted by adjusting the first plasma process parameters based on the difference between the modified LCDU and the target LCDU. Specifically, embodiments of the present application envision changing the micro-loading effect to bring the modified LCDU within the process window. For example, the first plasma may be adjusted by changing any one of the first plasma process parameters such as chamber pressure, chamber temperature, RF source power, RF bias power, RF waveform, the composition and flow rates of various process and carrier gases, as well as other parameters.

For example, in one embodiment, the deposition profile and/or deposition thickness of the material comprising silicon 107 may be adjusted by changing the composition of the first plasma by adjusting the molecular weights of the first plasma process gases. In other embodiments, for example, the micro-loading effect may be changed by modifying the gas sticking coefficient of the first plasma process gases in order to adjust the deposition thickness of the material comprising silicon 107 within each of the through openings.

As next illustrated in block 210, after adjusting the first plasma, the hole pattern formed within the patterned resist layer 106 is formed again over another substrate in the same manner described in FIGS. 1A-1B. Then, using the adjusted first plasma, blocks 200-208 are repeated until a modified hole pattern is formed with an LCDU that is less than or equal to the target LCDU.

Advantageously, the LCDU of a modified hole pattern is determined and compared to a target LCDU in an early stage of fabrication. One advantage of this is that the process parameters of the first plasma may be adjusted and an improved hole pattern that meets the target LCDU may be formed on another substrate before proceeding to etching the hole pattern into the dielectric layer, reducing the time and cost of semiconductor fabrication.

Figure 4:
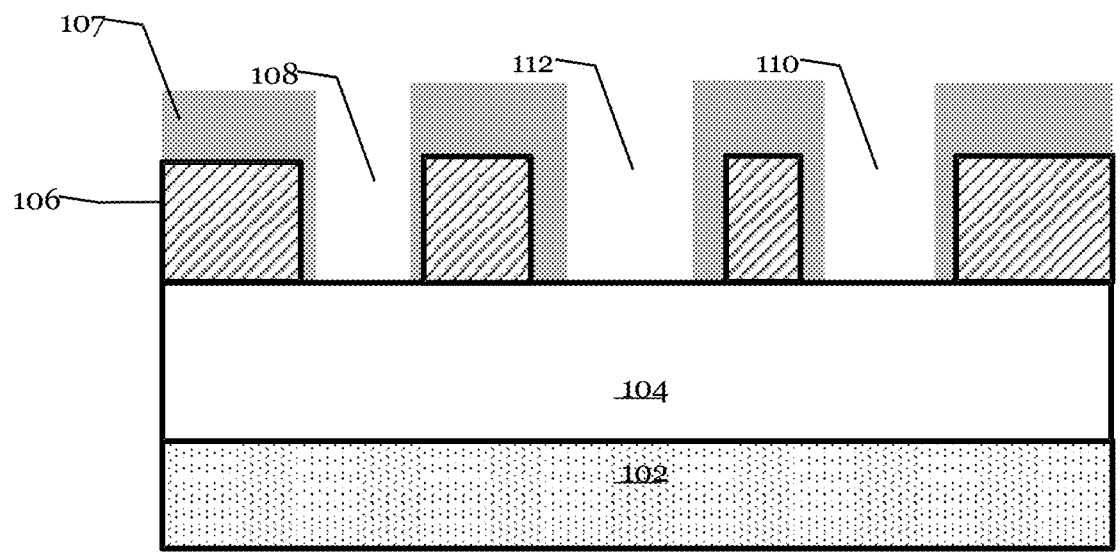
Figure 5:
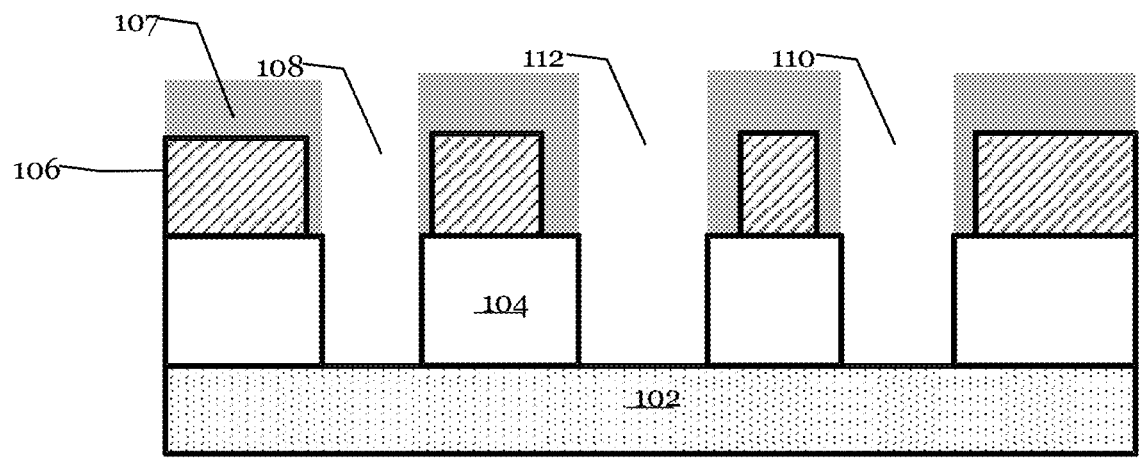
Figure 6:
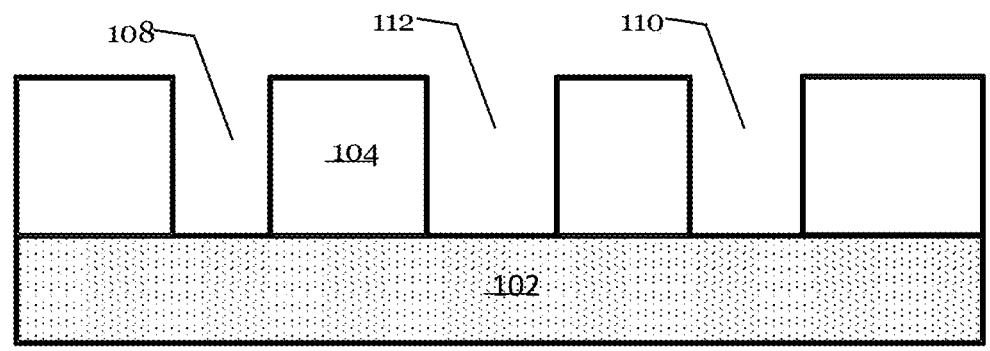

FIGS. 4-6 illustrate cross-sectional views of a semiconductor device during various stages of fabrication in accordance with an embodiment of the present application, wherein FIG. 4 illustrates a cross-sectional view of a semiconductor device after the device undergoes a plasma trimming process, FIG. 5 illustrates the device after a plasma etching process is used to transfer a hole pattern to a dielectric layer through a patterned etch mask, and FIG. 6 illustrates the device after the etch mask is removed.

In this embodiment, after using a plasma to deposit a material comprising silicon over a hole patterned resist layer to form a modified hole pattern with an improved etch selectivity and LCDU, the modified hole pattern may be transferred to a dielectric layer by exposing the dielectric layer to a second plasma.

Accordingly, this embodiment continues from FIG. 2B. Referring now to FIG. 4, the substrate 102 undergoes a plasma trimming process, which selectively removes the material comprising silicon 107 deposited on the bottom surfaces of the modified through openings.

As illustrated in FIG. 2B, when depositing the material comprising silicon 107 over the patterned resist layer 106 via the first plasma, the material comprising silicon 107 may be deposited over the bottom surfaces of the through openings, covering the previously exposed portions of the dielectric layer 104.

In this embodiment, the modified hole pattern, is intended to be used as an etch mask to form holes in the dielectric layer 104 and expose the contact regions on the surface of the substrate 102 in the next step. The thickness of the material comprising silicon 107 on the bottom surface of the modified through openings may protect the previously exposed portions of the dielectric layer 104 to a point in which a plasma etching process may not be able to remove material from the dielectric layer 104 to a sufficient depth to expose the contact regions of the substrate 102. Therefore, in such cases, an optional plasma trim process may be used to remove the material comprising silicon 107 from the bottom surfaces of the through openings, while the patterned resist layer 106 and the sidewalls of the modified through openings remain covered by the material comprising silicon 107. As known to a person having ordinary skill in the art, the plasma trim process may comprise, for example, isotropic plasma etching although an isotropic etching chemistry may also be used in some embodiments.

In various embodiments, the film thickness of the material comprising silicon 107 deposited on the bottom surfaces of the modified through openings may have a negligible effect on a subsequent plasma etching process (e.g., where it can be removed) and the plasma trim process may be skipped.

Advantageously, as previously illustrated in FIG. 2B, the film thickness of the material comprising silicon 107 deposited over the patterned resist layer 106 and on the sidewalls of the through openings is greater than the film thickness of the material comprising silicon 107 deposited on the bottom surfaces of the through openings. One advantage of this is that the thicker layers of the material comprising silicon 107 will be etched at a slower rate than the thinner layer of the material comprising silicon 107 deposited on the bottom surface of the through openings during the plasma trim process. This ensures that the plasma trim process will completely remove the material comprising silicon 107 covering the bottom surfaces of the through openings while the areas above the patterned resist layer 106 and the sidewalls of the through openings remain covered, as illustrated in FIG. 4.

In various embodiments, the plasma trim process may not be necessary because the film thickness of the layer comprising silicon 107 deposited on the bottom surfaces of the modified through openings may be thin enough to have a negligible effect on a plasma etching process and allow for enough material to be removed from the dielectric layer 104 to expose the contact regions formed on the substrate 102.

Referring to FIG. 5, using the modified hole pattern as a final etch mask, the modified hole pattern with an improved LCDU is formed in the dielectric layer 104 by exposing the dielectric layer 104 to a second plasma. The second plasma may comprise an anisotropic reactive ion etching (RIE) process, for example, an inductively coupled plasma reactive ion etching process (ICP-RIE) or a capacitively coupled reactive ion etch (CCP-RIE) known by those with ordinary skill in the art. The patterned dielectric layer 104 exposes the contact regions formed on the surface of the substrate 102.

Advantageously, in this embodiment, the material comprising silicon 107 deposited over the patterned resist layer 106 increases the thickness of the patterned resist layer 106 vertically, improving the verticality of the process (because less vertical ions are blocked by the patterned resist layer 106 thereby improving the ion angle distribution). The more vertical process further improves the LCDU further by smoothing protruding regions of the sidewalls. As explained above, when forming the patterned resist layer 106, the film thickness of the EUV resist layer used is selected to be as thin as possible which may result in a low etch selectivity (e.g. resist loss) if it is used as an etch mask. One advantage of the high etch selectivity provided by the material comprising silicon 107 is that the film thickness of the resist used in the patterned resist layer 106 may be selected to be as thin as possible to avoid vertical deformation while the higher etch selectivity protects against resist loss. Accordingly, as illustrated in FIG. 5 there is no resist loss when patterning the dielectric layer 104.

Referring to FIG. 6, the patterned etch mask comprising the patterned resist layer 106 and the material comprising silicon 107 is removed. As known by those with skill in the ordinary art, the patterned etch mask may be removed using a plasma ashing process.

In various embodiments, the processes described in FIGS. 2A-2B, 4-6 may be all performed within the same plasma etch chamber without having to move the substrate 102 to another chamber.

In various embodiments, the holes formed in the dielectric layer 104 are filled with a conductive material such as aluminum, titanium, or molybdenum for example, to form contact plugs or vias on the substrate 102.

Figure 7:
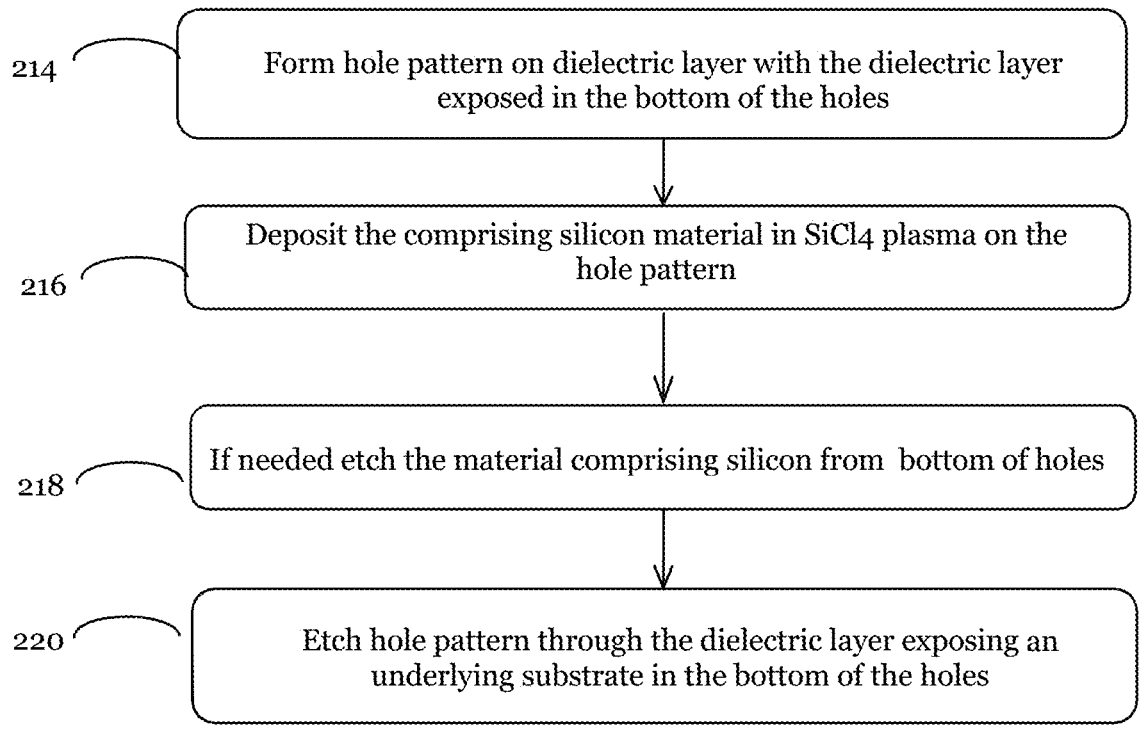
FIG. 7 illustrates a flow chart of a method used to improve the etch selectivity and LCDU of a hole pattern and transfer the hole pattern to a dielectric layer in accordance with an embodiment of the present application.

FIG. 7 illustrates a flow chart of a method used to improve the etch selectivity and LCDU of a hole pattern and transfer the hole pattern to a dielectric layer in accordance with an embodiment of the present application.

As illustrated in block 214, a patterned resist layer 106 is formed as a hole pattern comprising through openings over a dielectric layer 104 that is formed over a substrate 102, exposing portions of the top surface of the dielectric layer 104 on the bottom surfaces of the through openings. The patterned resist layer may be formed in the same manner described and illustrated in FIGS. 1A-1B.

As next illustrated in block 216, a modified hole pattern with an improved LCDU is formed by selectively depositing a material comprising silicon 107 over the patterned resist layer 106 using a first plasma, forming a patterned etch mask. The material comprising silicon 107 may be deposited using the first plasma in the same manner described and illustrated in FIGS. 2A-2B.

As next illustrated in block 218, an optional plasma trim process is used to remove the material comprising silicon 107 deposited on the bottom surfaces of the through openings. The plasma trim process may be performed in the same manner described and illustrated in FIG. 4. In various embodiments, the plasma trim process may not be necessary for the reasons described in FIG. 4.

As next illustrated in block 220 and, holes are etched in the dielectric layer 104, exposing the contact regions formed on the surface of the substrate 102 using the modified hole pattern as an etch mask. The holes are etched in the same manner described in FIG. 5.

Figure 8A:
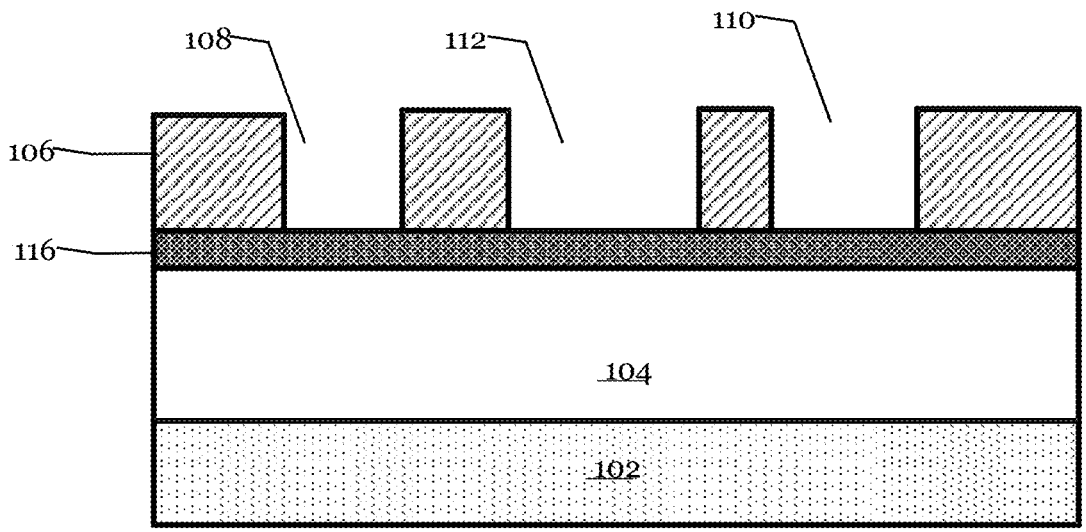
Figure 8B:
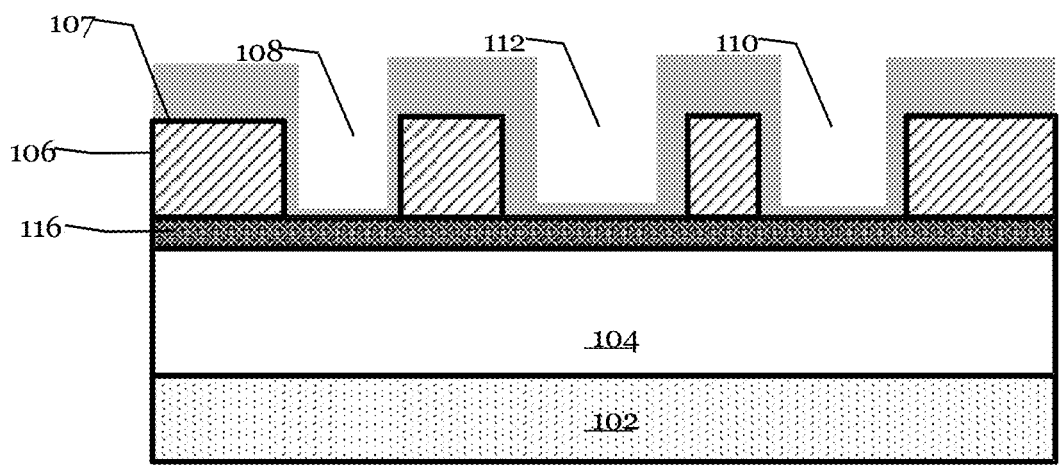
Figure 8C:
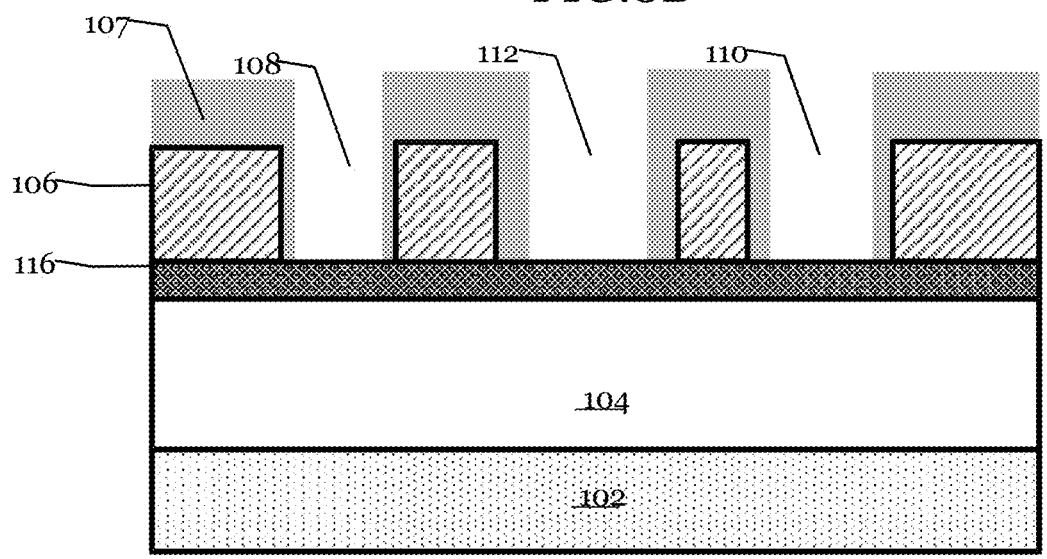
Figure 8D:
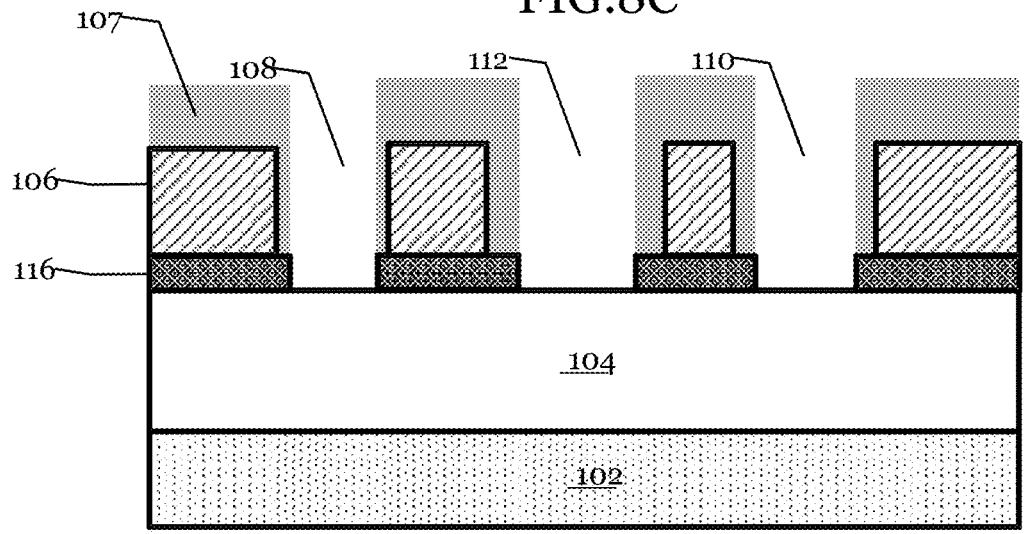
Figure 8E:
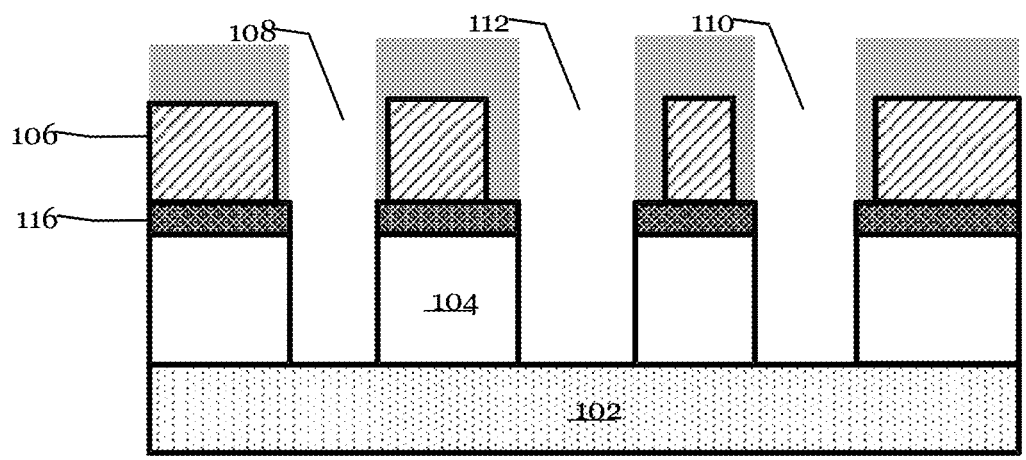
Figure 8F:
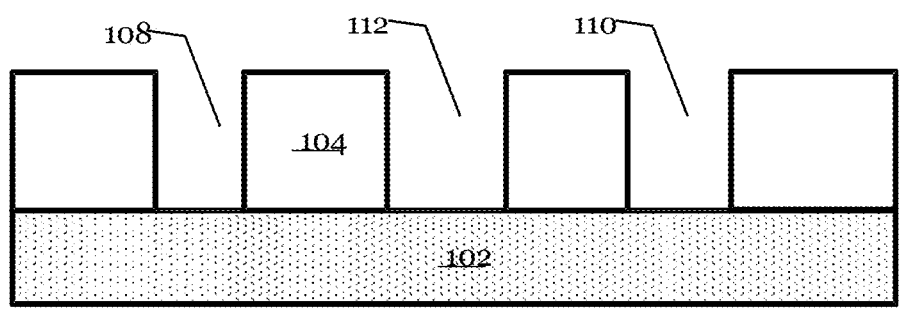

FIGS. 8A-8F illustrate cross-sectional views of a semiconductor device during various stages of fabrication in accordance with an alternative embodiment in the present application, wherein FIG. 8A illustrates the device after forming a hole pattern in a resist layer, FIG. 8B illustrates the device after forming a modified hole pattern with an improved LCDU, FIG. 8C illustrates the device after undergoing a plasma trim process, FIG. 8D illustrates the device after etching through an underlying layer, forming an etch mask, FIG. 8E illustrates the device after a hole pattern is formed in a dielectric layer, and FIG. 8F illustrates the device after removing the etch mask.

In this embodiment the LCDU of a hole pattern formed in a resist layer is improved, using the previously discussed first plasma, which is then used to form a patterned etch mask that further includes an additional underlying layer comprising an anti-reflective coating layer and a hard mask layer.

Referring to FIG. 8A, an underlying layer 116 is formed between a patterned resist layer 106 and a dielectric layer 104 that is formed over a substrate 102.

In various embodiments, the underlying layer 116 may be a stack of films comprising, for example, an underlay adjacent to the patterned resist layer 106 and one or more hard mask layers below the underlay. For example, the hard mask layers may comprise a silicon anti-reflective coating layer (ARC), a metal layer, a metal oxide layer, titanium nitride, or tantalum nitride. The underlay (included in the underlying layer 116) may also be a bottom anti-reflective coating (BARC) layer. For example, the BARC layer may be a silicon ARC layer, an organic ARC layer, a metal ARC layer, a metal oxide ARC layer, or a titanium nitride ARC layer. The BARC layer must be selected to be compatible with the patterned resist layer 106. In some embodiments, the underlying layer 116 may be a sacrificial layer that is removed after being used as a hard mask in a subsequent etch step.

The patterned resist layer 106 may comprise the same material and may be formed in the same manner described in FIGS. 1A-1B, wherein the patterned resist layer 106 comprises a hole pattern comprising through openings having portions of the upper surface of the BARC layer exposed through the bottom surfaces of the through openings. Similarly, the dielectric layer 104, and the substrate 102 may comprise the same material and may be respectively formed in the same manner described in FIGS. 1A-1B.

For example, as an illustration of the stochastic processes described above, the patterned resist layer 106 may comprise through openings having varying critical dimensions (e.g. the first through opening 108 having a first critical dimension, the second through opening 110 having a second critical dimension, and the third through opening 112 having a third critical dimension, as described in FIGS. 1A-1B), resulting in a hole pattern with an undesirable LCDU, as described in FIGS. 1A-1B.

In various embodiments, a first LCDU of the hole pattern may be determined by measuring the critical dimension of each through opening and calculating the corresponding 3 sigma variation in the same manner described in FIGS. 1A-1B above.

Referring to FIG. 8B, a modified hole pattern is formed by depositing a material comprising silicon 107 over the patterned resist layer 106 and on the sidewalls and bottom surfaces of the through openings via a first plasma. The material comprising silicon 107 may comprise the same material and may be formed in the same manner as described in FIGS. 2A-2B. Similarly, the first plasma may comprise the same material and may be formed in the same manner as described in FIGS. 2A-2B.

Depositing the material comprising silicon 107 over the patterned resist layer 106 and on the sidewalls of the through openings forms a modified hole pattern with modified through openings having reduced critical dimensions (e.g. the fourth critical dimension, the fifth critical dimension, and the sixth critical dimension described in FIGS. 2A-2B).

Advantageously, the material comprising silicon 107 is selectively deposited so that more material is deposited on the sidewalls of through openings with greater critical dimensions (the wider openings) than the sidewalls of through openings with smaller critical dimensions (narrower openings), as described in FIG. 2B. One advantage of depositing more material comprising silicon on the sidewalls of wider through openings is that it reduces the variation between the critical dimensions of each through opening, resulting in an improved LCDU, as described in FIGS. 2A-2B.

In various embodiments, the critical dimensions of the modified through openings are measured and a modified LCDU is determined in the manner described in FIGS. 2A-2B. The modified LCDU being less than the first LCDU.

In various embodiments, the modified hole pattern is intended to be used as an intermediate etch mask to transfer the modified hole pattern to the hard mask layer through the exposed portions of the BARC layer, forming a final etch mask in a subsequent step. Advantageously, as illustrated in FIG. 8B, the film thickness of the material comprising silicon 107 deposited over the patterned resist layer 106 and the sidewalls of the through openings is greater than the film thickness deposited on the bottom of the through openings, as described in FIG. 4.

In various embodiments, for the reasons described in FIGS. 1A-1B, before undergoing the first plasma depositing the material comprising silicon 107, the patterned resist layer 106 may undergo a descum process to remove excess photoresist residue by exposing the patterned resist layer 106 to a third plasma. The third plasma may be formed in the same manner described in FIG. 1B.

Referring to FIG. 8C, the material comprising silicon 107 deposited on the bottom surfaces of the modified through openings is selectively removed. After depositing the material comprising silicon 107 on the bottom surfaces of the through openings, the portions of the BARC layer previously exposed on the bottom surfaces of the through openings are covered, as described in FIG. 4. Therefore, a plasma trim process is used to remove the material comprising silicon 107 deposited on the bottom surfaces of the through openings, re-exposing the portions of the BARC layer on the bottom surfaces of the through openings. As known to a person having ordinary skill in the art, the optional plasma trim process may comprise, for example, isotropic plasma etching, gas phase etching, or wet etching.

In various embodiments the material comprising silicon 107 may be deposited in a manner such that the plasma trim process is not necessary, as described in FIG. 4.

Referring to FIG. 8D, a final etch mask is formed by transferring the modified hole pattern to the hard mask layer through the BARC layer using the modified hole pattern as an intermediate etch mask. The final etch mask exposes portions of the top surface of the dielectric layer 104 through the bottom surfaces of the through openings transferred to the underlying layer 116. As known by those with ordinary skill in the art, the modified hole pattern may be transferred to the underlying layer 116 using anisotropic reactive ion etching (RIE) process, for example, in an inductively coupled plasma reactive ion etching process (ICP-RIE) or a capacitively coupled reactive ion etch (CCP-RIE).

Advantageously, in the same manner described in FIG. 5 above, the material comprising silicon 107 deposited over the patterned resist layer 106 increases the thickness of the partnered resist layer vertically, improving its etch selectivity. Accordingly, as illustrated in FIG. 8D, there is no resist loss when etching the underlying layer 116.

Referring to FIG. 8E, using the final etch mask, the modified hole pattern with an improved LCDU is formed in the dielectric layer 104. The holes are formed in the dielectric layer 104 by exposing the dielectric layer 104 to a second plasma through the final etch mask. The second plasma may be formed in the same manner as the second plasma described in FIG. 5. As previously described, forming the modified hole pattern in the dielectric layer 104 exposes the contact regions formed on a major surface of the substrate 102 that are aligned with the through holes.

Referring to FIG. 8F the final etch mask is selectively removed. As known by those with ordinary skill in the art, a plasma ashing process, for example, may be used to remove the final etch mask.

In various embodiments, the processes described in FIGS. 8A-8F may be all performed within the same plasma etch chamber without having to move the substrate 102 to another chamber.

In various embodiments, the holes formed in the dielectric layer 104 are filled with a conductive material such as aluminum, titanium, or molybdenum for example, to form contact plugs or vias on the substrate 102.

Figure 9:
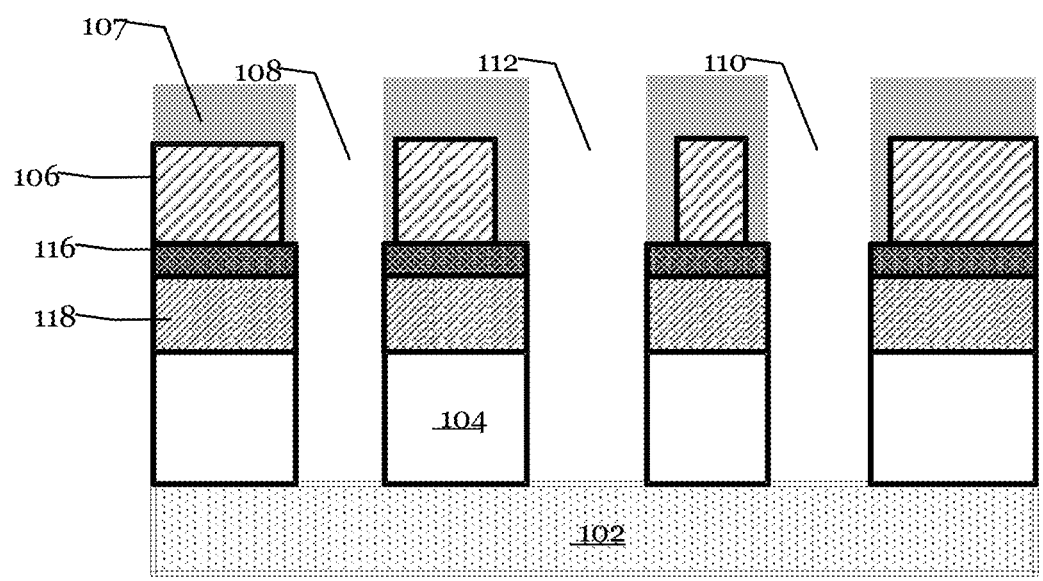
FIG. 9 illustrates a cross-sectional view of a semiconductor device during an intermediate stage of fabrication in accordance with an embodiment of the present application.

FIG. 9 illustrates a cross-sectional view of a semiconductor device during an intermediate stage of fabrication in accordance with an embodiment of the present application.

In this embodiment the LCDU of a hole pattern formed in a resist layer is improved, using the previously discussed first plasma, which is then used to form a patterned etch mask that further includes an underlying layer and an organic planarizing layer (OPL).

Referring to FIG. 9, a patterned resist layer 106 is formed over an underlying layer 116, the underlying layer 116 is formed over an OPL 118, and the OPL 118 is formed over a dielectric layer 104 that is formed over a substrate 102.

The OPL 118 may comprise a self-planarizing organic material known by those with ordinary skill in the art. For example, the OPL 118 may be a self-planarizing organic material and may include carbon, hydrogen, oxygen, and may optionally include nitrogen, fluorine, and silicon. In various embodiments, the OPL 118 may be a standard CxHy polymer. The OPL 118 is selected to be compatible with the hard mask layer of the underlying layer 116.

The patterned resist layer 106, the underlying layer 116, the dielectric layer 104, and the substrate 102 may comprise of the same material and may be respectively formed in the same manner described in FIGS. 1A-1B and FIG. 8A. The hole pattern formed in the patterned resist layer 106 comprises through openings (e.g. the first through opening 108, the second through opening 110, and the third through opening 112 as, described in FIG. 1A-1B and FIG. 8A) having a significant variation between critical dimensions and an undesired LCDU due to stochastic processes associated with EUV lithography, as previously explained. In various embodiments, the critical dimensions of the through openings may be measured and a first LCDU may be determined in the same manner described in FIGS. 1A-1B and FIG. 8A.

Next, a modified hole pattern comprising through openings with reduced critical dimensions (e.g. the fourth critical dimension, the fifth critical dimension, and the sixth critical dimension described in FIGS. 2A-2B and FIG. 8B) and a modified LCDU is formed by selectively depositing a material comprising silicon 107 via a first plasma in the same manner described in FIGS. 2A-2B and FIG. 8B, with the modified LCDU being less than the first LCDU. In various embodiments, the critical dimensions may be measured and the LCDU may be determined in the same manner described in FIGS. 2A-2B and FIG. 8B.

Then, the substrate 102 may undergo an optional plasma trim process (e.g. the plasma trim process described in FIG. 4 and FIG. 8C) to remove the material comprising silicon 107 deposited on the bottom surfaces of the through openings, and the modified hole pattern is used as a first intermediate etch mask to transfer the modified hole pattern to the hard mask layer in the same manner described in FIG. 8D, forming a second intermediate etch mask (e.g. the final etch mask formed in FIG. 8D).

Then, as illustrated in FIG. 9, using the second intermediate etch mask, the modified hole pattern is transferred to the OPL 118, forming a final etch mask. As known by those with ordinary skill in the art, the modified hole pattern may be transferred to the OPL 118 using anisotropic reactive ion etching (RIE) process or an inductively coupled plasma reactive ion etching process (ICP-RIE), for example.

Then, using the final etch mask, the modified hole pattern is formed in the dielectric layer 104, exposing the contact regions formed on a major surface of the substrate 102, by exposing the dielectric layer 104 to a second plasma (e.g. the second plasma described in FIG. 5 and FIG. 8E).

In various embodiments, the final etch mask may be removed using a plasma ashing process, performed in the same manner described in FIG. 6 and FIG. 8F.

In various embodiments, the holes formed in the dielectric layer 104 are filled with a conductive material such as aluminum, titanium, or molybdenum for example, to form contact plugs or vias on the substrate 102.

Figure 10:
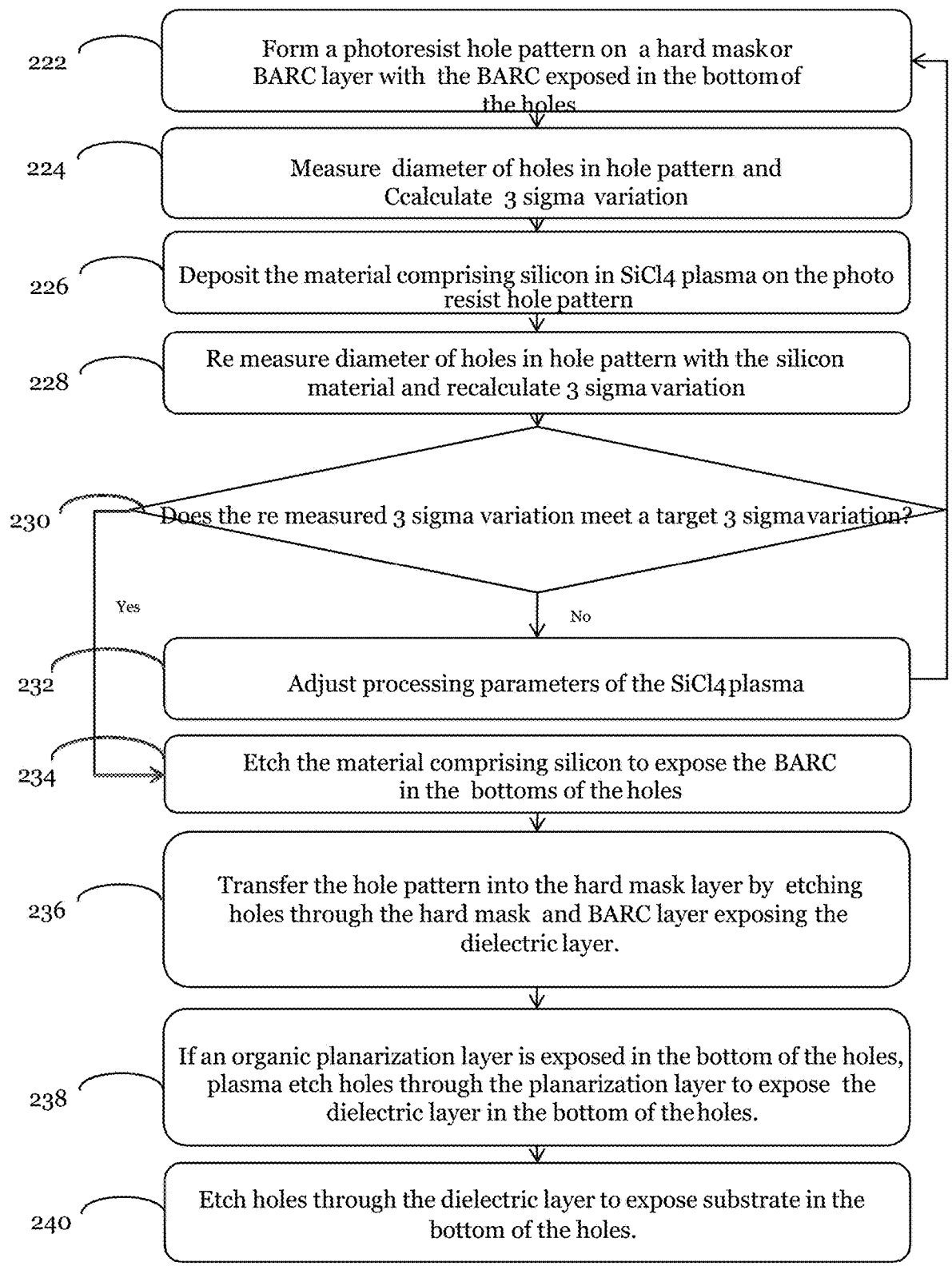
FIG. 10 illustrates a flow chart of a method used for adjusting a plasma deposition process in order to form a hole pattern that meets a target LCDU in accordance with an embodiment of the present application.

FIG. 10 illustrates a flow chart of a method used for adjusting the first plasma in order to form a hole pattern that meets a target LCDU in accordance with an embodiment of the present application.

In block 222, a hole pattern comprising through openings is formed as a patterned resist layer 106 over an underlying layer 116. Upper surfaces of the BARC layer of the underlying layer 116 are exposed on the bottom surfaces of the through openings formed in the patterned resist layer 106. The underlying layer 116 is formed over a dielectric layer 104 which is formed over a substrate 102. This pattern resist layer 106 may be formed as described and illustrated using FIG. 8A.

As next illustrated in block 224, the critical dimensions (e.g. the diameters of the through openings) are measured and a first LCDU is determined. These critical dimensions and the first LCDU may be measured and calculated, respectively, as described and illustrated in FIG. 8A. As described above, due to stochastic processes associated with EUV lithography, there is a significant variation between the critical dimensions of the through openings resulting in a hole pattern with an undesirable LCDU.

As next illustrated in block 226, a modified hole pattern comprising modified through openings is formed by selectively depositing a material comprising silicon 107 over the patterned resist layer 106 using a first plasma. This material comprising silicon 107 may be deposited using the first plasma as described and illustrated in FIG. 8B.

As next illustrated in block 228, the critical dimensions of the modified through openings are measured and a modified LCDU is determined. These modified critical dimensions and modified LCDU may be measured and calculated, respectively, as described and illustrated in FIG. 8B.

As next illustrated in block 230, the modified LCDU is compared to a target LCDU. If the modified LCDU less than or equal to the target LCDU, the first plasma process parameters do not need to be adjusted at this time and the method continues to block 234. If the modified LCDU is greater than the target LCDU, then the method continues to block 232.

As next illustrated in block 232, the process parameters of the first plasma are adjusted based on the difference between the modified LCDU and the target LCDU and the method then repeats blocks 222-230 on another substrate until the target LCDU is met.

As next illustrated in block 234, the substrate 102 undergoes an optional plasma trim process in order to remove the material comprising silicon 107 deposited on the bottom surfaces of the through openings to re-expose the BARC layer of the underlying layer 116. This plasma trim process may be performed as described and illustrated in FIG. 8C.

As next illustrated in block 236, the modified hole pattern is used as a intermediate etch mask to transfer the hole pattern to the underlying layer 116, forming a final etch mask that exposes the dielectric layer 104 through the bottom surface of the through openings transferred to the underlying layer 116. This final etch mask may be formed as described and illustrated in FIG. 8D.

As next illustrated in block 238, if an optional OPL 118 is formed between the underlying layer 116 and the dielectric layer 104, the final etch mask formed in the previous step is used as an intermediate etch mask to transfer the modified hole pattern to the OPL 118, forming a new final etch mask. The optional OPL and the new final etch mask may formed and described as illustrated in FIG. 9.

As next illustrated in block 240, if the OPL 118 was formed over the dielectric layer 104, then using the final etch mask formed in block 238, the modified hole pattern is transferred to the dielectric layer 104, in the same manner described in FIG. 9. Alternatively, if the OPL 118 was not formed over the dielectric layer 104, the etch mask formed in block 236 is used as the etch mask, in the same manner described in FIG. 8E.

As mentioned above, an advantage of depositing the material comprising silicon 107 over the patterned resist layer 106 is that it increases the etch selectivity of the final etch mask, and therefore, there is no resist loss when patterning the underlying layer 116, the OPL 118, and the dielectric layer 104, as illustrated and described in FIGS. 8D-8E and FIG. 9.

Figure 11:
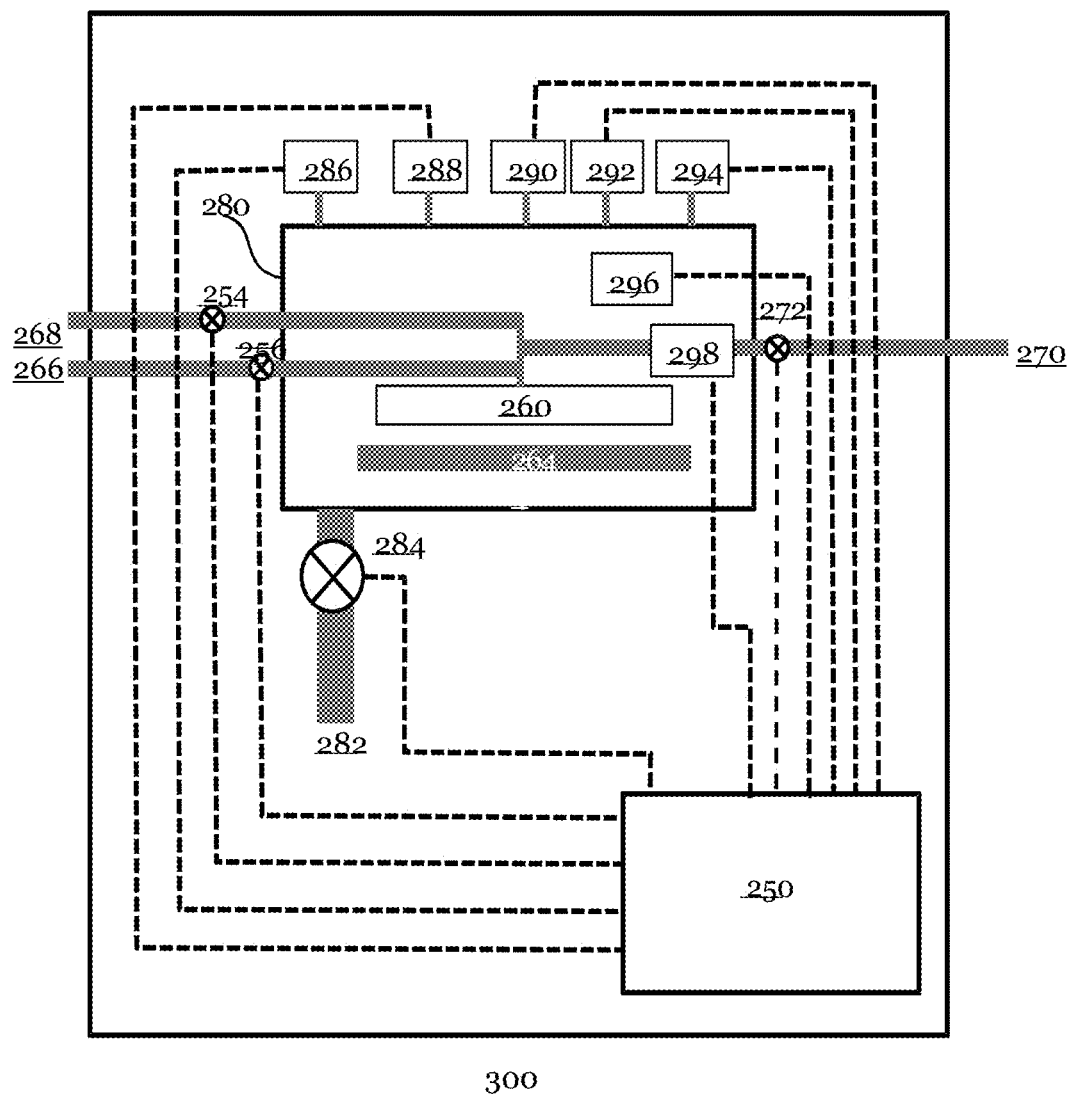
FIG. 11 illustrates a block diagram of a plasma deposition tool according to an embodiment of the present application.

FIG. 11 illustrates a block diagram of a plasma tool 300 for depositing the material comprising silicon 107 (e.g. the material comprising silicon described in FIGS. 2A and 2B) according to an embodiment of the present application.

Referring to FIG. 11, the plasma tool 300 includes a processing chamber 280 in which a substrate is processed using the first plasma (e.g. the first plasma described in FIGS. 2A-2B). The processing chamber 280 comprises a substrate table 264 configured to support the substrate 102 during processing. The material comprising silicon 107 is selectively deposited onto the substrate within the processing chamber by injecting the first plasma through a mixture gas shower head 260 of the processing tool. For example, the mixture gas shower head 260 may comprise a single mixed reaction cavity that is filled with the precursor gasses, mixing gasses, and the carrier gasses that mix to form the first plasma and one set of exit holes for dispensing the first plasma in the direction of the substrate.

The processing chamber 280 includes a vacuum pump 284 coupled to a vacuum line 282 in order to purge residual precursor gasses from the processing chamber 280 and may also be connected to a pressure system to maintain a target pressure in certain embodiments. The processing chamber 280 may further include machine tools such as a heater 296 and a temperature sensor 298 used to heat the substrate and control the temperature within the processing chamber 280.

As illustrated in FIG. 11, the plasma tool 300 includes a precursor gas 268, a mixture gas 266, and a carrier gas coupled to the mixture gas shower head 260. In various embodiments, the precursor gas 268 may comprise a silicon precursor such as silicon tetrachloride, the mixture gas 266 may comprise hydrogen, and the carrier gas may comprise as an inert gas such as argon, helium, or nitrogen.

In various embodiments, the plasma tool 300 may comprise of a system of mass flow controllers and sensors for control of gas flow. Accordingly, the plasma tool 300 may comprise a first mass flow controller 254, a second mass flow controller 256, a third mass flow controller 272, the vacuum pump 284, the heater 296, the temperature sensor 298, V-I sensor 286, and substrate sensors 288, 290, 292, and 294.

The precursor gas 268, the mixture gas 266, and the carrier gas 270 are coupled to and controlled by the first mass flow controller 254, the second mass flow controller 256, and the third mass flow controller 272, respectively.

The plasma tool 300 may further include a controller 250 to control various aspects of the first plasma process. For example, the controller may comprise a processor, microprocessor, or any other type of controller known in the art. Machine components such as the heater 296 and the temperature sensor 298 within the processing chamber 280 as well as the mass flow controllers 254, 256, and 258, the vacuum pump 284, and other components external to the processing chamber 280 are all coupled to and controlled by the controller 250.

The controller 250 may be connected to V-I sensor 286, and substrate sensors 288, 290, 292, 294 used to monitor the first plasma as it is being deposited to provide conductions of the plasma as well as optionally composition and thickness data in real time. This feedback data can be used by the controller 250 to continuously adjust the process as the film is being deposited and, for example, to turn the process off when the target deposition point is reached.

Specifically, measurement data from the substrate sensors 288, 290, 292, and 294, and the temperature sensor 298 may be received at the controller 250 while the controller 250 generates control signals that may be sent to the first mass flow controller 254, the second mass flow controller 256, the third mass flow controller 272, the vacuum pump 284, and the heater 296.

The controller 250 may receive measurement or metrology data from the substrate sensors 288, 290, 292, and 294 taken at multiple points across the substrate to measure process uniformity and to measure the thickness and composition of the material comprising silicon 107 across the substrate 102 in-situ and in real time. For example, multiple across substrate sensors in a multi-substrate plasma tool such can be used to monitor and tune film thickness and composition uniformity from the top of the substrate 102 to the bottom of the substrate 102. Multiple across substrate sensors in a single substrate plasma tool can be used to monitor and tune film thickness and composition uniformity from the center of the substrate 102 to the edge of the substrate 102.

The substrate sensors may be coupled to and/or located within the processing chamber 280 for monitoring various parameters of the substrate 102, the plasma tool 300 and/or the first plasma process. The substrate sensors may include various types of sensors including, but not limited to, optical sensors (such as cameras, lasers, light, reflectometer, spectrometers, ellipsometric, etc.), capacitive sensors, ultrasonic sensors, gas sensors, or other sensors that may monitor a condition of the substrate 102, and/or the plasma tool 300. In one example embodiment, one or more optical sensors may be used to measure the thickness and refractive index of the depositing precursor in real time. In another example embodiment, a spectrometer may be used to measure a film thickness of one or more layers of the material comprising silicon 107 provided on the substrate. In yet another embodiment, a residual gas analyzer (RGA) may be used to detect precursor breakdown for real-time chemical reaction completion detection.

The controller 250 may also receive process parameters inputted by the user including, but not limited to, conformality, profile, and deposition rate based on standard plasma etch parameters such as chamber pressure, chamber temperature, RF source power, RF bias power, RF waveform (e.g., continuous wave RF, pulsed RF, square pulse, sawtooth pulse, and the like), deposition time, and the composition and flow rates of various process and carrier gases. Advantageously, allowing the user to tune the first plasma in order to meet a target LCDU.

Based on the data from the various substrate sensors and the user inputted process parameters, the controller 250 generates control signals to the temperature sensor 298 and the heater 296 in order to adjust the heat within the processing chamber 280. As the heater 296 heats the processing chamber 280, the controller 250 constantly or periodically monitors the temperature sensor 298 to track the temperature of the processing chamber 280 in order to send control signals to the heater 296 to maintain the temperature in the processing chamber 280.

Once the controller 250 determines, based on the data provided by the temperature sensor 298, that the target temperature of the processing chamber 280 has been reached, the controller generates control signals and data signals to activate to the first mass flow controller 254, the second mass flow controller 256, and the third mass flow controller 272 and provide, based on the process parameters supplied by the user, a target flow rate of the precursor gas 268 to the first mass flow controller 254, a target flow rate of the mixing gas 266 to the second mass flow controller 256, and a target flow rate of the carrier gas 270 to the third mass flow controller 272. Once the controller 250 determines that the corresponding flow rates have been established, the controller 250 provides power to the processing chamber 280 to power the plasma through the bias and source electrodes. Based on the measurements from the V-I sensor 286, the power being supplied to the bias and source electrodes may be adjusted.

As understood by those with ordinary skill in the art, the first mass flow controller 254, the second mass flow controller 256, and the third mass flow controller 272 each may comprise a closed loop control system connected to a flow rate sensor and an adjustable proportional valve that allows each mass flow controller to constantly or periodically monitor and internally maintain the target flow rates of each gas via the flow rate sensor and the adjustable proportional valve.

In various embodiments, once the controller 250 determines, based on the user inputted data, that the deposition process time has been met, the controller 250 generates control signals to deactivate the first mass flow controller 254, the second mass flow controller 256, and the third mass flow controller 272.

In various embodiments, the controller 250 may use or analyze the substrate sensor data to determine when to end one or more steps of the first plasma process. For example, controller 250 may receive data from a residual gas analyzer to detect an endpoint of a layer modification step. In another example, controller 250 may utilize spectroscopic ellipsometry to detect an average film thickness of the material comprising silicon 107 being deposited on the substrate 102 during deposition and provide an indication of film thickness changes during the first plasma process. In another example, controller 250 may utilize spectroscopic ellipsometry to detect the refractive index of the material comprising silicon 107 being deposited on the substrate 102 during deposition and provide an indication of film composition change during the first plasma process. In some embodiments, the controller 250 may automatically end the first plasma process when a thickness objective is achieved. In some embodiments, controller 250 may automatically adjust one or more parameters such as the ratio of hydrogen to silicon tetrachloride to argon, for example, during the first plasma process to achieve the desired film thickness over each through opening. The substrate sensor data and the controller 250 may also be utilized to achieve a desired substrate throughput objective. Further, the substrate sensor data and the controller 250 may be utilized to achieve a desired thickness and composition along with a desired substrate throughput or alternatively target a combination. Accordingly, using embodiments of the present invention, large improvements in LCDU can be obtained. In one exemplary process, the inventors of this application were able to improve LCDU especially at contacts with lower pitches. Specifically, for contacts patterned at pitches of 30 nm, the process of the embodiments of the application lowered LCDU by about 30%, e.g. from about 3.3 nm to about 2.2 nm. While the improvement at larger pitches was still significant, it was less than the narrower pitches. For example, for contacts patterned at pitches of 20 nm, the process of the embodiments of the application lowered LCDU by about 20%, e.g. from about 2.2 nm to about 1.7 nm.

What is claimed is:

1. A method of forming a semiconductor device, the method comprising:
   forming a hole pattern in a resist layer disposed over a substrate, the substrate comprising contact regions disposed over a major surface of the substrate and a dielectric layer disposed over the contact regions, the resist layer being disposed over the dielectric layer, the hole pattern comprising through openings in the resist layer that are aligned with the contact regions;
   modifying the hole pattern by depositing a material comprising silicon within the through openings by exposing the hole pattern to a first plasma generated from a gas mixture comprising $SiCl_4$ and hydrogen, wherein the through openings comprise a first through opening having a first critical dimension and a second through opening having a second critical dimension greater than the first critical dimension, and wherein a first thickness of the material deposited on sidewalls of the first through opening is greater than a second thickness of the material deposited on sidewalls of the second through opening; and
   etching holes in the dielectric layer by exposing the dielectric layer to a second plasma through the modified hole pattern, the holes exposing the contact regions.

2. The method of claim 1, wherein a thickness of the material comprising silicon deposited on sidewalls of the through openings is greater than a thickness of the material deposited on bottom surfaces of the through openings.

3. The method of claim 1, wherein the hole pattern has a first local critical dimension uniformity value based on critical dimensions of the through openings, wherein the modified hole pattern has a second local critical dimension uniformity value based on critical dimensions of the through openings with the material comprising silicon, wherein the first local critical dimension uniformity value is greater than the second local critical dimension uniformity value.

4. The method of claim 1, wherein the resist layer is an extreme ultraviolet (EUV) photoresist layer or an e-beam photoresist layer and wherein forming the hole pattern comprises:
 exposing the resist layer to EUV light or an e-beam; and
 developing the resist layer after the exposing to form the hole pattern.

5. The method of claim 1, further comprising filling the holes with a conductive material to form a contact plug or via.

6. The method of claim 1, further comprising performing a descum process by exposing the hole pattern to a third plasma prior to exposing the hole pattern to the first plasma.

7. The method of claim 1, further comprising exposing the modified hole pattern to a plasma trim process and removing the material comprising silicon from bottom surfaces of the through openings to expose the bottom surfaces of the through openings.

8. The method of claim 1, further comprising:
 forming a hard mask layer between the resist layer and the dielectric layer;
 forming a bottom antireflective coating (BARC) layer between the resist layer and the hard mask layer; and
 prior to forming holes in the dielectric layer, forming a etch mask by transferring the hole pattern to the hard mask layer through the BARC layer, wherein forming holes in the dielectric layer comprises using the etch mask to form the holes.

9. The method of claim 8, wherein the BARC layer comprises a silicon antireflective coating (ARC) layer, an organic ARC layer, a metal ARC layer, a metal oxide ARC layer, or a titanium nitride ARC layer, and wherein the hard mask layer comprises a silicon antireflective coating layer, a metal layer, a metal oxide layer, titanium nitride, or tantalum nitride.

10. The method of claim 1, further comprising:
 measuring the critical dimensions of the through openings;
 determining a first local critical dimension uniformity value based on the critical dimensions of the through openings;
 measuring the critical dimensions of the through openings with the material comprising silicon;
 determining a second local critical dimension uniformity value based on the critical dimensions of the through openings with the material comprising silicon;
 generating a set of process parameters by adjusting process parameters of the first plasma based on a difference between the second local critical dimension uniformity value and a target local critical dimension uniformity value; and
 performing the steps of forming the hole pattern, modifying the hole pattern, and etching the holes in another substrate with the first plasma modified with the set of process parameters.

11. A method of forming a semiconductor device, the method comprising:
 forming a hole pattern in a resist layer disposed over a substrate, the substrate comprising contact regions disposed over a major surface of the substrate and a dielectric layer disposed over the contact regions, the resist layer being disposed over the dielectric layer, the hole pattern comprising through openings in the resist layer that are aligned with the contact regions;
 modifying the hole pattern by depositing a material comprising silicon within the through openings by exposing the hole pattern to a first plasma generated from a gas mixture comprising $SiCl_4$ and hydrogen; and
 measuring critical dimensions of the through openings with the material comprising silicon;
 determining a local critical dimension uniformity value based on the critical dimensions of the through openings with the material comprising silicon;
 generating a set of process parameters by adjusting process parameters of the first plasma based on a difference between the local critical dimension uniformity value and a target local critical dimension uniformity value;
 on further substrates, repeating the steps of forming the hole pattern, modifying the hole pattern with the first plasma using the generated set of process parameters, measuring the critical dimensions of the through openings with the material comprising silicon, determining the local critical dimension uniformity value, generating the set of process parameters until the local critical dimension uniformity value reaches a target local critical dimension uniformity value;
 performing the steps of forming the hole pattern in another substrate and modifying the hole pattern with the first plasma using the generated set of process parameters; and
 etching holes in the dielectric layer by exposing the dielectric layer to a second plasma through the modified hole pattern, the holes exposing the contact regions.

12. The method of claim 11, wherein a thickness of the material comprising silicon deposited on sidewalls of the through openings is greater than a thickness of the material deposited on bottom surfaces of the through openings.

13. The method of claim 11, wherein the through openings comprise a first through opening having a first critical dimension and a second through opening having a second critical dimension greater than the first critical dimension, and wherein a first thickness of the material deposited on sidewalls of the first through opening is greater than a second thickness of the material deposited on sidewalls of the second through opening.

14. The method of claim 11, further comprising performing a descum process by exposing the hole pattern to a third plasma prior to exposing the hole pattern to the first plasma.

15. The method of claim 11, further comprising exposing the modified hole pattern to a plasma trim process and removing the material comprising silicon from bottom surfaces of the through openings to expose the bottom surfaces of the through openings.

16. The method of claim 11, further comprising:
 forming a hard mask layer between the resist layer and the dielectric layer;
 forming a bottom antireflective coating (BARC) layer between the resist layer and the hard mask layer; and
 prior to forming holes in the dielectric layer, forming a etch mask by transferring the hole pattern to the hard mask layer through the BARC layer, wherein forming holes in the dielectric layer comprises using the etch mask to form the holes.

17. A method of forming a semiconductor device, the method comprising:
- forming a hole pattern in a resist layer disposed over a substrate, the substrate comprising contact regions disposed over a major surface of the substrate and a dielectric layer disposed over the contact regions, the resist layer being disposed over the dielectric layer, the hole pattern comprising through openings in the resist layer that are aligned with the contact regions;
- measuring critical dimensions of the through openings;
- determining a local critical dimension uniformity value based on the critical dimensions of the through openings;
- generating a set of process parameters by adjusting process parameters of a first plasma based on a difference between the local critical dimension uniformity value and a target local critical dimension uniformity value;
- modifying the hole pattern by depositing a material comprising silicon within the through openings by exposing the hole pattern to the first plasma generated from a gas mixture comprising $SiCl_4$ and hydrogen and using the generated set of process parameters; and
- etching holes in the dielectric layer by exposing the dielectric layer to a second plasma through the modified hole pattern, the holes exposing the contact regions.

18. The method of claim 17, wherein a thickness of the material comprising silicon deposited on sidewalls of the through openings is greater than a thickness of the material deposited on bottom surfaces of the through openings, wherein the through openings comprise a first through opening having a first critical dimension and a second through opening having a second critical dimension greater than the first critical dimension, and wherein a first thickness of the material deposited on sidewalls of the first through opening is greater than a second thickness of the material deposited on sidewalls of the second through opening.

19. The method of claim 17, further comprising performing a descum process by exposing the hole pattern to a third plasma prior to exposing the hole pattern to the first plasma.

20. The method of claim 17, further comprising exposing the modified hole pattern to a plasma trim process and removing the material comprising silicon from bottom surfaces of the through openings to expose the bottom surfaces of the through openings.

21. The method of claim 8, further comprising:
- forming a self-planarizing organic material layer between the BARC layer and the hard mask layer; and
- prior to forming holes in the dielectric layer, the etch mask in the hard mask is formed by transferring the hole pattern to the hard mask layer through the self-planarizing organic material layer.

22. The method of claim 1, wherein the holes are formed by directly etching the dielectric layer through the modified hole pattern.

* * * * *